US005639386A

United States Patent [19]

Burke et al.

[11] Patent Number: 5,639,386

[45] Date of Patent: Jun. 17, 1997

[54] INCREASED THRESHOLD UNIFORMITY OF THERMAL INK TRANSDUCERS

[75] Inventors: Cathie J. Burke; Daniel S. Brennan, both of Rochester, N.Y.; Keith G. Kamekona, Hawthorne, Calif.; Roberto E. Proano, Rochester, N.Y.

[73] Assignee: Xerox Corporation, Stamford, Conn.

[21] Appl. No.: 400,638

[22] Filed: Mar. 7, 1995

Related U.S. Application Data

[62] Division of Ser. No. 972,277, Nov. 5, 1992, abandoned.

[51] Int. Cl.$^6$ .................... H01L 21/00

[52] U.S. Cl. .................... 216/27; 156/633.1; 156/657.1; 216/2

[58] Field of Search .................... 156/633.1, 657.1, 156/659.11; 216/2, 27, 41, 76, 99; 437/918

[56] References Cited

U.S. PATENT DOCUMENTS

| | | | |
|---|---|---|---|
| 3,516,915 | 6/1970 | Mayer et al. . | |
| 4,063,210 | 12/1977 | Collver | 388/7 |
| 4,370,668 | 1/1983 | Hara et al. . | |
| 4,532,530 | 7/1985 | Hawkins . | |
| 4,947,193 | 8/1990 | Deshpande . | |
| 5,169,806 | 12/1992 | Hawkins et al. | 437/233 |

FOREIGN PATENT DOCUMENTS

| | | |
|---|---|---|
| 0090963 A2 | 10/1983 | European Pat. Off. . |
| 0281141 | 9/1988 | European Pat. Off. . |
| 3613372 A1 | 9/1987 | Germany . |

OTHER PUBLICATIONS

C.P. Wu et al., "Wafer Charging Control in High-Current Implanters", J. Electrochem. Soc., vol. 13, Oct. 10, 1992, pp. 2-9.

A Sedra and K. Smith. "Microelectronic Circuits"; Saunders College Publishing, USA (1991) pp. A4-A6, F1.

*Primary Examiner*—William Powell

[57] ABSTRACT

The resistors of heater elements are formed by chemical vapor deposition of polycrystalline silicon at at least one of a flat temperature profile of 620° C. and a ramped temperature profile of 620° C. to 640° C. in a first embodiment. Such method of forming the polysilicon result in a predominantly uniform grain size of approximately 1000 Å, where grain size can vary between 200 Å to 1000 Å. Alternatively, the resistors are formed by chemical vapor deposition of amorphous polysilicon at at least one of a flat temperature profile at a temperature below 580° C. and a ramped temperature profile of 565° C. to 575° C. In the alternative embodiment, the polysilicon has a grain size of at least 1000 Å. During the ion implantation of either p-type or n-type dopants into the polysilicon, a flood gun located in an ion implanter emits low energy electrons to neutralize the build-up of positive charges on the polysilicon surface. Because the low energy electrons prevent the build-up of electric charges on the surface of the polysilicon, the usual build-up of an electrical field on the surface of the polysilicon is eliminated, and the polysilicon can be uniformly doped by ion implantation of dopants. By using the flood gun during the fabrication of the heater elements of the printhead, the resistors of the heater elements and printheads have substantially uniform sheet resistances relative to each other. The sheet resistances of the resistors in the printhead vary less than 3% and preferably less than 1%. Such low variations in sheet resistance prevent undervoltage and overvoltage from being applied to the resistors and extend the lifetime of the heater element and thus, the printhead.

13 Claims, 4 Drawing Sheets

INCREASED THRESHOLD UNIFORMITY OF THERMAL INK TRANSDUCERS

This is a Division of application Ser. No. 07/972,277 filed Nov. 5, 1992, now abandoned.

BACKGROUND OF THE INVENTION

1. Field of the Invention

The present invention is directed to ink jet printing systems, and in particular to drop-on-demand ink jet printing systems having printheads with heater elements.

2. Description of the Related Art

Ink jet printing systems can be divided into two types. The first type is a continuous stream ink jet printing system and the second type is a drop-on-demand printing system.

In a continuous stream ink jet printing system, ink is emitted in a continuous stream under pressure through at least one orifice or nozzle. The stream is perturbed so that the stream breaks up into droplets at a fixed distance from the orifice. At the break-up point, the droplets are charged in accordance with digital date signals end passed through electrostatic field which adjusts the trajectory of each droplet in order to direct the ink droplets to e gutter for recirculation or to a specific location on a recording medium.

In a drop-on-demand ink jet printing system, a droplet is expelled from an orifice directly to a position on a recording medium in accordance with digital data signals. A droplet is not formed or expelled unless the droplet is to be placed on the recording medium. Because the drop-on-demand ink jet printing item requires no ink recovery, charging or deflection, such system is much simpler than the continuous stream ink jet printing system. Thus, ink jet printing systems are generally drop-on-demand ink jet printing systems.

Further, there are two types of drop-on-demand ink jet printing systems. The first type uses a piezoelectric transducer to produce a pressure pulse that expels a droplet from a nozzle. The second type uses thermal energy to produce a vapor bubble in an ink-filled channel to expel an ink droplet.

The first type of drop-on demand ink jet printing system has a printhead with ink-filled channels, nozzles at ends of the channels and piezoelectric transducers near the other ends to produce pressure pulses. The relatively large size of the transducers prevents close spacing of the nozzles, and physical limitations of the transducers result in low ink drop velocity. Low ink drop velocity seriously diminishes the tolerances for drop velocity variation end directionality and impacts the system's ability to produce high quality copies. Further, the drop-on-demand printing system using piezoelectric transducers suffers from slow printing speeds.

Due to the above disadvantages of printheads using piezoelectric transducers, drop-on-demand ink jet printing systems having printheads which use thermal energy to produce vapor bubbles in ink-filled channels to expel ink droplets are generally used. A thermal energy generator or heater element, usually a resistor, is located at a predetermined distance from a nozzle of each one of the channels. The resistors are individually addressed with an electrical pulse to generate heat which is transferred from the resistor to the ink.

The transferred heat causes the ink to be super heated, i.e., far above the ink's normal boiling point. For example, a water based ink reaches a critical temperature of 280° C. for bubble nucleation. The nucleated bubble or water vapor thermally isolates the ink from the heater element to prevent further transfer of heat from the resistor to the ink. Further, the nucleating bubble expands until all of the heat stored in the ink in excess of the normal boiling point diffuses away or is used to convert liquid to vapor which, of course, removes heat due to heat of vaporization. During the expansion of the vapor bubble, the ink bulges from the nozzle and is contained by the surface tension of the ink as a meniscus.

When the excess heat is removed from the ink, the vapor bubble collapses on the resistor, because the heat generating current is no longer applied to the resistor. As the bubble begins to collapse, the ink still in the channel between the nozzle and bubble starts to move towards the collapsing bubble, causing a volumetric contraction of the ink at the nozzle and resulting in the separating of the bulging ink as an ink droplet. The acceleration of the ink out of the nozzle while the bubble is growing provides the momentum and velocity to expel the ink droplet towards a recording medium, such as paper, in a substantially straight line direction. The entire bubble expansion and collapse cycle takes about 20 microseconds (μs). The channel can be retired after 100 to 500 μs minimum dwell time to enable the channel to be refilled and to enable the dynamic refilling factors to be somewhat dampened.

To eject an ink droplet, each heater element must become hot enough to cause the ink to reach a bubble nucleation temperature of preferably 280° C. for water based ink. In order for the heater element to generate the thermal energy to cause bubble nucleation, an operating voltage is applied to a resistor of the heater element. Typically, the operating voltage is proportional to the resistance of the resistor, i.e., the higher the resistance, the higher the operating voltage.

Conventionally, polysilicon is used to form the resistors of the heater elements. The resistance value of the resistors is chosen based on the actual required power ($Power=V \times I=I^2 \times R=V^2/R$) for ejection of the ink droplet through bubble nucleation. Once the required power and voltage has been chosen, the resistance value is determined. The fabrication of the determined resistance is controlled by the sheet resistance (ohm/square; Ω/□) of the polysilicon and the size of the resistor. The size of the resistor can be tightly controlled by photolithographic techniques. The sheet resistance of the polysilicon is primarily controlled by impurity doping, preferably by ion implantation, and annealing of the ion doped polysilicon.

FIG. 1 illustrates the variation of sheet resistance of a wafer of p-type polysilicon doped with conventional ion implantation and annealing process. The lines in FIG. 1 represent contour lines and each contour line represents an increase (+) or a decrease (−) of the sheet resistance by 1% from the mean sheet resistance. Thus, a large number of contour lines indicates greater deviation from the mean sheet resistance. As shown, the sheet resistance within a length of the wafer varies by 12.80% and typically, the sheet resistance can vary from 10% to 15%. Thus, a plurality of resistors formed by ion implantation during the fabrication of the heater elements results in variation in sheet resistance between the resistors. Because the size of the plurality of the resistors are the same and the sheet resistance varies by 10% to 15%, the resistance of the resistors between each other will vary by 10% to 15%.

Although highly resistive polysilicon loads with sheet resistance in the order of 2 to 4 KΩ/□ are used in static RAM design, the sheet resistances of resistors used in thermal ink jet application must be both highly accurate, e.g., about 40 Ω/□, and tightly controlled. Variations in resistance between the resistors have adverse effects on the operation of the heater elements and the lifetime of the heater elements, which in turn, will affect the operation and lifetime of the printhead. When the chosen voltage is applied to a resistor having a resistance greater than the desired resistance, a power less than the power required for bubble nucleation is generated, and thus, the ejection of an ink droplet is prevented. When the chosen voltage is applied to a resistor having a resistance less than the desired resistance, a power greater than the power required for bubble nucleation is generated, and such generated power causes ink to bake on the resistor to form an insulator layer between the ink and the resistor. The formation of the insulator layer on resistors of lower resistance and non-ejection of ink droplets by resistors of higher resistance require increase in the voltage necessary to produce ink droplets over the lifetime of the printhead. Such increase in voltage shortens the operating lifetime of the printhead.

The following patents disclose various printheads having resistors made of polysilicon, but none of the patents discloses substantially uniform sheet resistance between the resistors of the heater elements and method of fabricating such resistors.

U.S. Pat. No. 4,947,193 to Desphande discloses an improved thermal ink jet printhead having a plurality of heating elements in ink channels selectively addressable by electrical signals to eject ink droplets from nozzles located at one end of the ink channels on demand. The heating elements each have a passivated layer of resistive material that has non-uniform sheet resistance in a direction transverse to the direction of ink in the channels. The non-uniform sheet resistance provides a substantially uniform temperature across the width of the resistive layer, so that the power required to eject a droplet is reduced and the droplet size dependence on electrical signal energy is eliminated.

U.S. Pat. No. 4,370,660 to Hara et al. discloses a liquid ejecting recording process using a liquid ejecting recording head comprising a liquid discharging portion including an orifice for ejecting liquid droplets and a heat acting portion communicated with the orifice. The heat acting portion is a portion where heat energy for discharging liquid droplets acts on a liquid, and an electrothermal transducer has a structure laminated on a substrate with the layers in the following order: a lower layer, a resistive heater layer, and an upper layer from the substrate to the heat acting portion on the position of the heat acting portion. When a signal voltage is applied to the resistive heater layer and potentials $V_A$ and $V_B$ are applied to two electrodes A and B, a potential V applied to at least the surface portion of the upper layer is kept intermediate between $V_A$ and $V_B$ while the signal voltage is applied to the resistive heater layer.

In "Wafer Charging Control in High-Current Implanters" by Wu et al., Wu et al. examines and reviews wafer charging in high-current ion implanters, and the operation of the electron flood gun in the Varian 160-10 implanter. It is shown that flood gun electrons with energies up to 350 eV do reach the wafers and can cause damage when wafers are excessively overflooded. An in situ flood gun monitor using a capacitive pickup sensor is described. Experiments with the capacitive charge sensor have further shown that (i) wafers can self-charge during pump-down or venting of the target chamber, (ii) a slight overflooding is preferable to underflooding, and (iii) for perfect neutralization, the flood gun emission current should vary with the magnetic scanning of the ion beam across the wafers. Using metal oxide semiconductor capacitors as test vehicles, Wu et al. shows that other factors can also affect charging damage to devices during implantation, such as the thickness of the field oxide or photoresist relative to the ion penetration depth, the proper grounding of the back sides of wafers during implantation, and the polarity of the silicon underneath the gate oxide. The benefits of proper electron flood control are demonstrated, and operating procedures are recommended.

U.S. Pat. No. 4,532,530 to Hawkins discloses a carriage type bubble ink jet printing system having improved bubble generating resistors that operate more efficiently and consume lower power without sacrificing operating lifetime. The resistor material is heavily doped poly-crystalline silicon which can be formed on the same process lines with those for integrated circuits to reduce equipment costs and achieve higher yields. Glass mesas thermally isolate the active portion of the resistor from the silicon supporting substrate and from the electrode connecting points so that the electrode connection points are maintained relatively cool during operation. A thermally grown dielectric layer permits a thinner electrical isolation layer between the resistor and its protective ink interfacing tantalum layer and thus increases the thermal energy transfer to the ink.

The above references are incorporated by reference herein where appropriate for appropriate teachings of additional or alternative details, features and/or technical background.

OBJECTS AND SUMMARY OF THE INVENTION

It is an object of the present invention to provide an ink jet printing system having a printhead with resistors for extending the lifetime of the heater element.

It is another object of the present invention to provide an ink jet printing system having a printhead with resistors for improving the heater efficiency.

It is another object of the present invention to provide polysilicon resistors with uniform grain size and methods of fabricating such resistors.

It is another object of the present invention to provide resistors having uniform sheet resistance and methods of fabricating such resistors of a printhead.

It is a further object of the present invention to provide polysilicon resistors with uniform grain size of 200–300 Å, or 1000 Å and methods of fabricating such polysilicon resistors.

It is a further object of the present invention to provide resistors with sheet resistance variations of less than 3% and preferably, less than 1% and methods of fabricating such resistors of a printhead.

It is another object of the present invention to prevent undervoltage and overvoltage applied to the resistors of the printhead due to variations in sheet resistance between the resistors.

It is an object of the present invention to solve the problems of the prior art.

To achieve the foregoing and other objects and advantages, and to overcome the shortcomings discussed above, a flood gun is used during the ion implantation of dopants into polysilicon resistors to prevent build-up of charges on the resistor surfaces, and to uniformly dope the polysilicon resistors. By using the flood gun during the fabrication of the heater elements of the printhead, the resistors of the heater elements have substantially uniform sheet resistance relative to each other. The sheet resistance of the resistors in the printhead vary less than 3% and preferably, less than 1%. Such low variations in sheet resistance prevent undervoltage and overvoltage from being applied to the resistors and extend the lifetime of the heater elements and thus, the printhead.

Further, to obtain the uniform sheet resistance, the resistors are formed by chemical vapor deposition of silicon. In a first embodiment, the temperature in the tube is ramped from the pump end to the source end to compensate for gas depletion down the tube. Typically, the temperature is 620° C. at the load end, where the gas enters, 630° C. in the middle and 640° C. at the pump end. In a second embodiment, the tube is operated at a flat temperature profile of 620° C. and gas is injected from points along the length of the tube. In a third embodiment, the resistors are formed by chemical vapor deposition of amorphous silicon at ramped temperature profile, typically 565° C. at the load end, 570° C. in the middle, and 575° C. at the pump end. Alternatively, the amorphous silicon can be deposited at a flat temperature profile below 580° C. In either of the embodiments in which amorphous silicon is deposited, the amorphous silicon is converted to polycrystalline silicon in subsequent thermal cycles, typically at temperatures of 1000° C. Such methods of forming the polysilicon result in a predominantly uniform grain size of approximately 1000 Å, where the grain size can vary between 200 Å to 1000 Å in the first and second embodiments. In the third and fourth embodiments, after thermal cycling has been completed, the polysilicon has a uniform grain size of preferably 1000 Å to 1 μm.

During the ion implantation of either p-type or n-type dopants into the polysilicon, a flood gun located in the ion implanter emits low energy electrons to neutralize the build-up of charges on the surface of the polysilicon. Because the low energy electrons prevent the build-up of electric charges on the surface of the polysilicon, the usual build-up of an electrical field on the surface of the polysilicon is eliminated, and the polysilicon can be uniformly doped by ion implantation of dopants.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENTS

Figure 1:
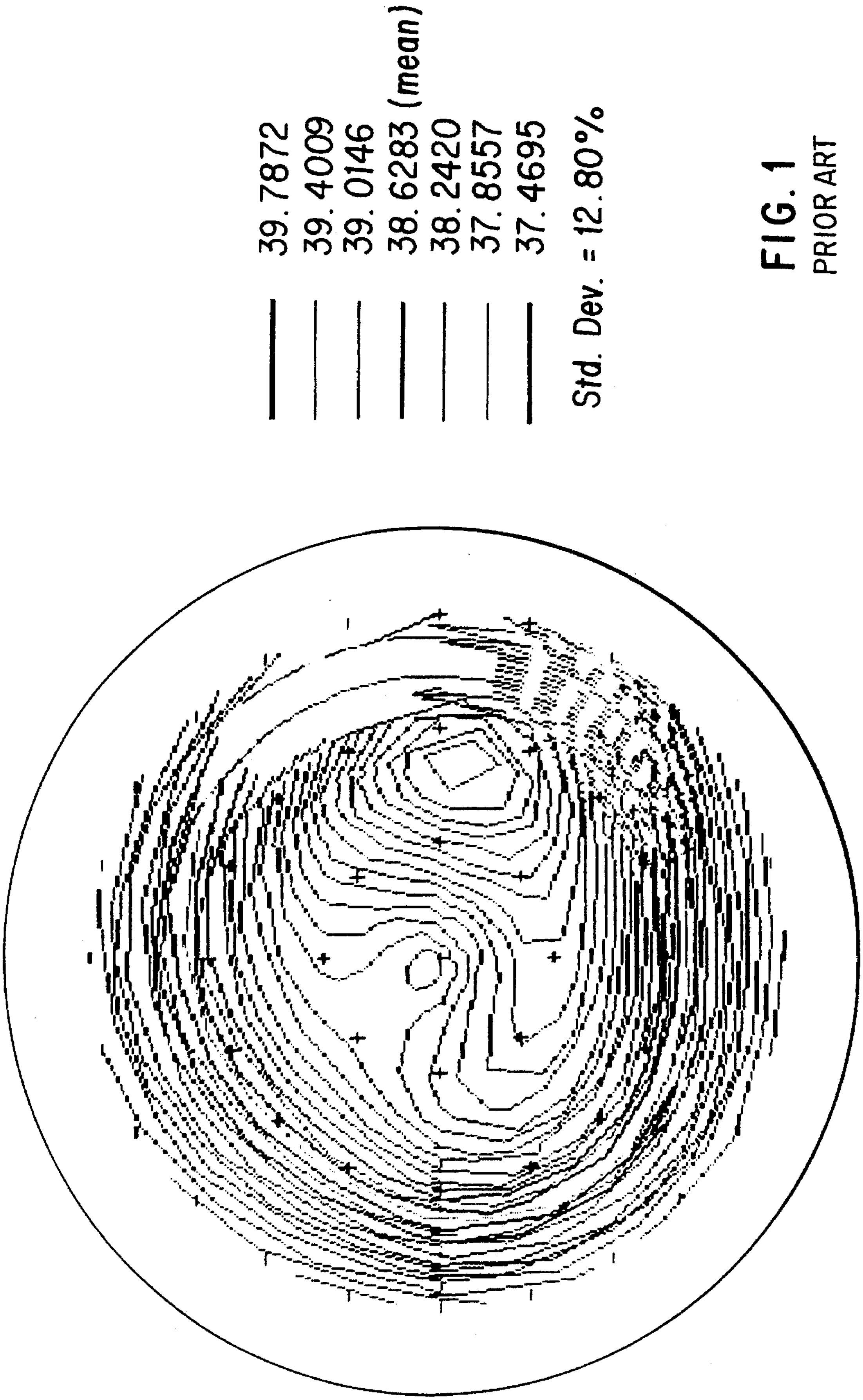
FIG. 1 PRIOR ART
FIG. 1 illustrates the variations in sheet resistance of a wafer doped with conventional process.
Figure 2:
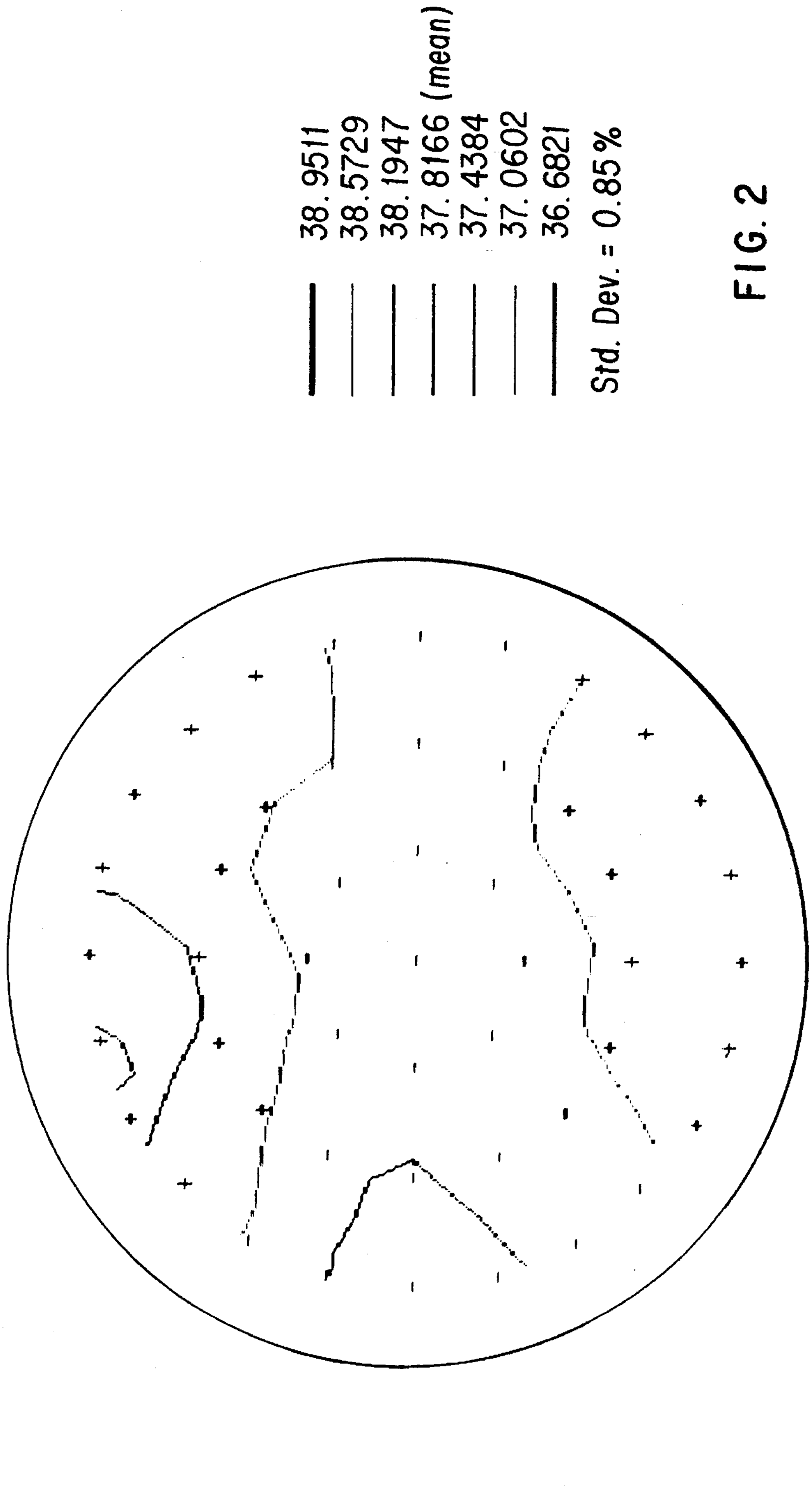
FIG. 2 illustrates the substantially uniform sheet resistance of a silicon wafer doped in accordance with the present invention.

FIG. 2 illustrates the substantially uniform sheet resistance of a silicon wafer doped in accordance with the present invention. It was discovered that doping of silicon wafer by ion implantation caused a build-up of charges on the wafer surface. Such build-up of charges on the wafer surface creates electric fields which deflect the n-type or p-type dopants and prevent the dopants from uniformly doping the silicon wafer. Further, when higher dopant concentration and ion beam current were used to dope the silicon wafer, the charging became more severe. To prevent the charging and to obtain uniform sheet resistance, a flood gun was used during ion implantation to substantially reduce the charging of the silicon wafer. As shown, the sheet resistance within a length of the wafer varied less than 1%.

Figure 3:
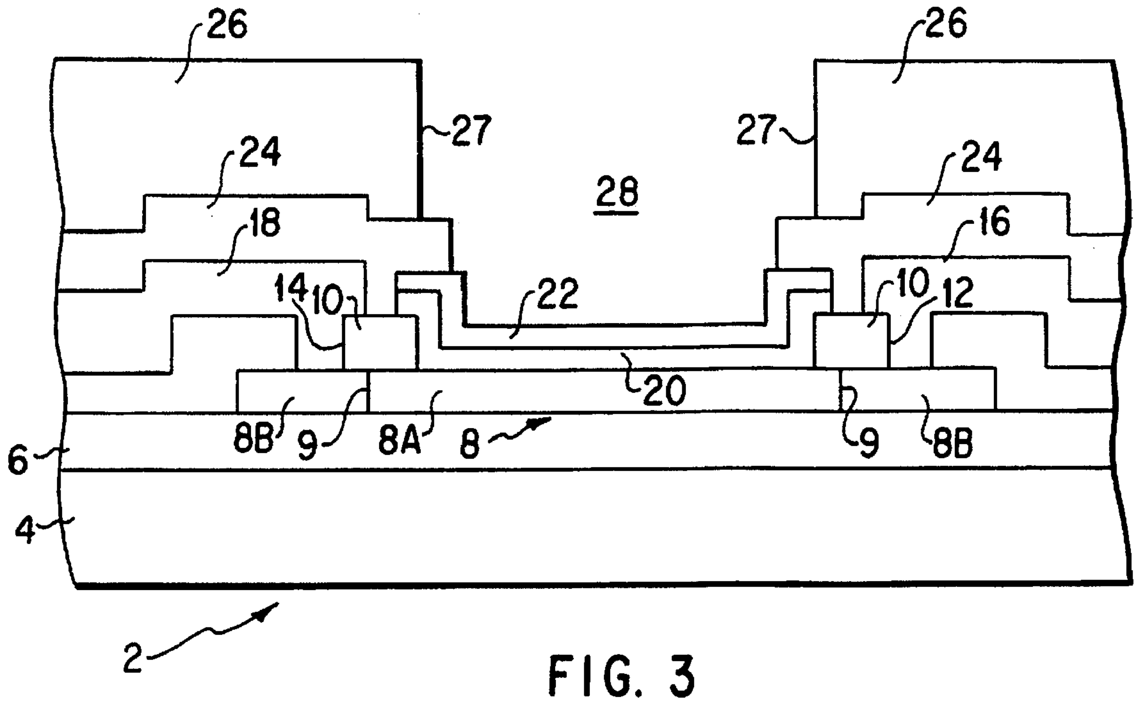
FIG. 3 is an enlarged, cross-sectional view of a heater element having a resistor doped in accordance with the present invention.

FIG. 3 is an enlarged, cross-sectional view of a heater element 2 which utilizes a flood gun during the fabrication of the resistor. Although only one heater element is illustrated, heater elements of the printheads are produced in mass quantities. Thus, by using a flood gun to obtain uniform sheet resistance, all of the resistors of the heater elements fabricated concurrently will have substantially uniform sheet resistance, and the resistances between individual resistors of the heater elements in a printhead and from printhead to printhead will be substantially uniform.

The heater element is formed on an underglaze layer 6 of a substrate 4. Polysilicon is deposited on top of the underglaze layer 6 and etched to form a resistor 8. The resistor 8 has a lightly doped n-type region 8A with two heavily doped n-type regions 8B formed at ends of the lightly doped n-type region 8A. The interfaces between the heavily doped and lightly doped regions define dopant lines 9. The dopant lines 9 define the actual heater area of the heater element.

Phosphosilicate glass (PSG) is deposited and reflowed on top of the resistor 8 and etched to form the PSG step regions 10 which expose a top surface of the resistor 8 and electrode vias 12, 14 for the addressing and common return electrodes 16, 18. Further, the PSG step regions 10 define the effective heater area. A dielectric isolation layer 20, of silicon nitride or silicon dioxide, is formed on top of the resistor 8 to electrically isolate the resistor 8 from the tantalum layer 22 and the ink. A tantalum (Ta) layer 22 is sputter deposited on the dielectric isolation layer 20 to protect the resistor 8 and the dielectric isolation layer 20 from the hot corrosive ink and cavitational pressures due to the collapsing bubble. The dielectric isolation and Ta layers 20, 22 are etched and aluminum (Al) is deposited and etched to form the addressing electrode 16 and common return electrode 18. For an overglaze passivation layer 24, a thick layer of CVD deposited phosphosilicate glass is deposited over the entire substrate and etched to expose the Ta layer 22. Finally, a thick insulative layer is deposited over the entire substrate and etched to form the pit layer 26 and the pit 28.

The following describes the various methods and materials used to form the heater elements illustrated in FIG. 3.

The substrate 4 of the heater element is preferably formed of silicon. Silicon is preferably used because it is electrically insulative and has good thermal conductivity for the removal of heat generated by the heater elements. The substrate is a (100) double side polished P-type silicon and has a thickness of 525 micrometers (μm). Further, the substrate 4 can be lightly doped, for example, to a resistivity of 10 ohm-cm degenerately doped to a resistivity between 0.01 to 0.001 ohm-cm to allow for a current return path or degenerately doped with an epitaxial, lightly doped surface layer of 2 to 25 μm to allow fabrication of active field effect or bipolar transistors.

The underglaze layer 6 is preferably made of silicon oxide ($SiO_2$) which is grown by thermal oxidation of the silicon substrate. However, it can be appreciated that other suitable thermal oxide layers can be used for the underglaze layer 6. The underglaze layer 6 has a thickness between 1 to 2 μm and in the preferred embodiment has a thickness of 1.5 μm.

Polysilicon is deposited on top of the underglaze layer by chemical vapor deposition (CVD) to a thickness of between 1,000 and 6,000 angstroms (Å) to form the resistor 8. In the preferred embodiment, the resistor 8 has a thickness of between 4,000 and 5,000 Å, and preferably has a thickness of 4,500 Å. The polysilicon is deposited using either a temperature ramp profile or a flat temperature profile during the chemical vapor deposition. In the first embodiment, the temperature in the tube is ramped from the pump end to the source end to compensate for gas depletion down the tube. Typically, the temperature is 620° C. at the load end, where the gas enters, 630° C. in the middle and 640° C. at the pump end. In a second embodiment, the tube is operated at a flat temperature profile of 620° C., and gas is injected from points along the length of the tube. Such methods of forming the polysilicon result in a predominantly uniform grain size of approximately 1000 Å, where the grain size can vary between 200 Å to 1000Å.

Larger grain sizes are preferable because less dopants diffuse into the larger grain boundaries during annealing of the ion doped polysilicon, and sheet resistances of the resistors become even more uniform. To achieve even larger uniform grain sizes, the resistors are formed by chemical vapor deposition of amorphous silicon at a ramped temperature profile, typically 565° C. at the load end, 570° C. in the middle, and 575° C. at the pump end. Alternatively, the amorphous silicon can be deposited at a flat temperature profile below 580° C. In either of the methods, the deposited amorphous silicon is converted to polycrystalline silicon in subsequent thermal cycles, typically at temperatures of 1000° C. The polysilicon layer formed by such methods has a predominantly uniform grain size of preferably 1000 Å, to 1 μm.

To obtain uniform sheet resistances between the plurality of resistors of the heater elements, a flood gun is used during the doping of the polysilicon. In the preferred embodiment, n-type dopants, e.g., phosphorus, are ion implanted into the polysilicon to form the lightly doped n-type region. The ion implanter (not shown) dopes the polysilicon with dopant concentration of $10^{15}$–$10^{16}$ atoms/cm$^2$ at 50–100 KeV. During the ion implantation, a stream of low energy electrons (median energy of 10–15 eV) is directed at the wafer by an electron flood gun (not shown) located within the ion implanter to neutralize the positive charge build-up on the polysilicon surface. The flood gun is driven by a current between 15–30 mA. The current is selected by monitoring the charge on the substrate wheel when the implanter ion beam is turned on, and adjusting the flood gun current to neutralize the charge. For the preferred polysilicon implant parameters, the current will be about 20 mA. Then, a mask is used to further heavily dope the ends of the resistor 8 by ion implantation with or without the flood gun. Either wet or dry etching is used to remove excess polysilicon to achieve the proper length of the resistor 8. Further, the polysilicon can be simultaneously used to form elements of associated active circuitry, such as, gates for field effect transistors and interconnects. It can be also appreciated that the polysilicon can be doped by solid source diffusion sources or a gas.

The PSG step region 10 is formed of preferably 7.5 wt. % PSG. To form the PSG, $SiO_2$ is deposited by CVD or is grown by thermal oxidation, and the $SiO_2$ is doped with preferably 7.5 wt. % phosphorus. The PSG is heated to reflow the PSG and create a planar surface to provide a smooth surface for aluminum metallization for the address and common return electrodes 16, 18. The PSG layer is etched to provide the electrode vias 12, 14 for the addressing and common return electrodes 16, 18 and to open the area over the heater that is exposed to the ink to provide the surface for the dielectric isolation and Ta layers 20, 22.

The dielectric isolation layer 20 is formed by pyrolytic chemical vapor deposition of silicon nitride ($Si_3N_4$) and etching of the $Si_3N_4$. The $Si_3N_4$ layer, which has been directly deposited on the exposed polysilicon resistor, has a thickness of 500 to 2,500 Å and preferably about 1,500 Å. The pyrolitic silicon nitride has very good thermal conductivity for efficient transfer of heat between the resistor and the ink when directly deposited in contact with the resistor.

Alternatively, the dielectric isolation layer 20 can be formed by thermal oxidation of the polysilicon resistors to form $SiO_2$. The $SiO_2$ dielectric layer can be grown to a thickness of 500 Å to 1 μm and in the preferred embodiment has a thickness from 1,000 to 2,000 Å.

The Ta layer 22 is sputter deposited on top of the dielectric isolation layer 20 by chemical vapor deposition and has a thickness of between 0.1 to 1.0 μm. The Ta layer 22 is masked and etched to remove the excess tantalum. The dielectric isolation layer 20 is then also etched prior to metallization of the addressing and common return electrodes 16, 18.

The addressing and common return electrodes 16, 18 are formed by chemical vapor deposition of aluminum into the electrode vias 12, 14 and etching the excess aluminum. The addressing and common return electrode terminals 82 (FIG. 6) are positioned at predetermined locations to allow clearance for electrical connection to the control circuitry after the channel plate 72 (FIG. 6) is attached to the substrate 4. The addressing and common return electrodes 16, 18 are deposited to a thickness of 0.5 to 3 μm, with a preferred thickness being 1.5 μm.

Figure 4:
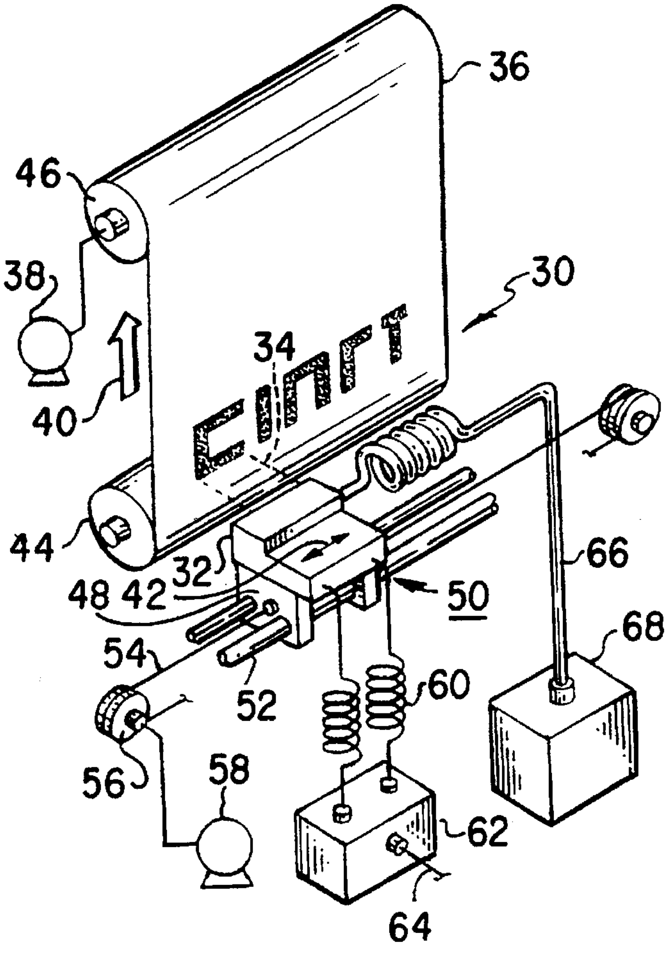
FIG. 4 is a schematic perspective of a carriage-type drop-on-demand ink jet printing system having a printhead incorporating the present invention.

The overglaze passivation layer 24 is formed of a composite layer of PSG and silicon nitride, $Si_xN_y$. The cumulative thickness of the overglaze passivation layer can range from 0.1 to 10 μm and the preferred thickness being 1.5 μm. A PSG having preferably 4 wt. % phosphorus is deposited by low pressure chemical vapor deposition (LOTOX) to a thickness of 5,000 Å. Next, silicon nitride is deposited by plasma assisted chemical vapor deposition to a thickness of 1.0 μm. Using a passivation mask, the silicon nitride is plasma etched and the PSG is wet etched off the heater element to expose the Ta layer 22 and terminals 82 of the addressing and common return electrodes 16, 18 for electrical connection to a controller 62 (FIG. 4). In an alternative embodiment, the overglaze passivation layer 24 can be formed entirely of PSG. Further, the overglaze passivation layer 24 can be formed of either of the above arrangements with an additional composite layer of polyimide of 1 to 10 μm thickness deposited over the PSG and/or silicon nitride layer(s).

Next, a thick film insulative layer such as, for example, RISTON®, VACREI®, PROBIMER 52®, PARAD®, or polyimide is formed on the entire surface of the substrate. The thickness of the thick insulative layer is between 5 to 100 μm and preferably, 10 to 50 μm. The thick insulative layer is photolithographically processed to enable the etching and removal of those portions of the thick insulative layer 26 over each heater element 2 to form the pit layer 26. The inner walls 27 of the pit layer 26 inhibit lateral movement of a vapor bubble generated by the heater and thus prevent the phenomenon of blow-out.

FIG. 4 is a schematic perspective of a carriage-type drop-on-demand ink jet printing system 30 having a printhead 32 incorporating the present invention. A linear array of ink droplet producing channels is housed in a printhead 32 of a reciprocating carriage assembly. Ink droplets 34 are propelled a preselected distance to a recording medium 36 which is stepped by a step motor 38 in the direction of an arrow 40 each time the printhead 32 traverses in one direction across the recording medium 36 in the direction of the arrow 42. The recording medium 36, such as paper, is stored on a supply roll 44 and stepped onto a roll 46 by the step motor 38 by means well known in the art. Further, it can be appreciated that sheets of paper can be used by using feeding mechanisms that are known in the art.

The printhead 32 is fixedly mounted on a support base 48 to comprise the reciprocating carriage assembly 50. The reciprocating carriage assembly 50 is movable back and forth across the recording medium 36 in a direction parallel thereto by sliding on two parallel guide rails 52 and perpendicular to the direction in which the recording medium 36 is stepped. The reciprocal movement of the printhead 32 is achieved by a cable 54 and a pair of rotatable pulleys 56, one of which is powered by a reversible motor 58.

The conduits 60 from a controller 62 provide the current pulses to the individual resistors in each of the ink channels. The current pulses which produce the ink droplets are generated in response to digital data signals received by the controller 62 through an electrode 64. A hose 66 from an ink supply 68 supplies the channel with ink during the operation of the printing system 30.

Figure 5:
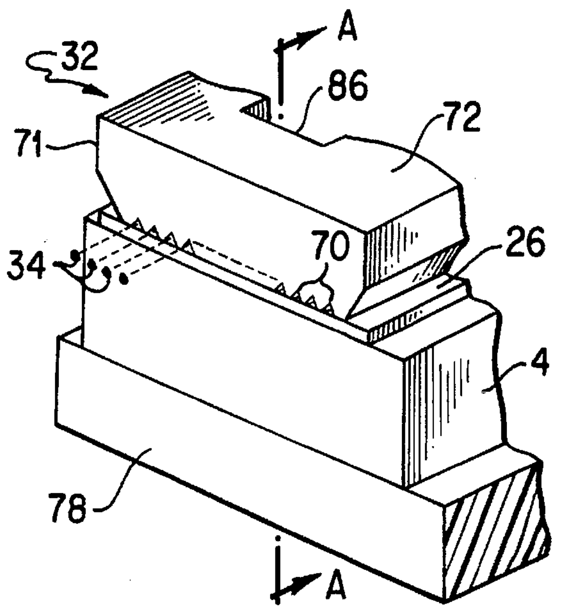
FIG. 5 is an enlarged schematic isometric view of the printhead illustrated in FIG. 4.
Figure 6:
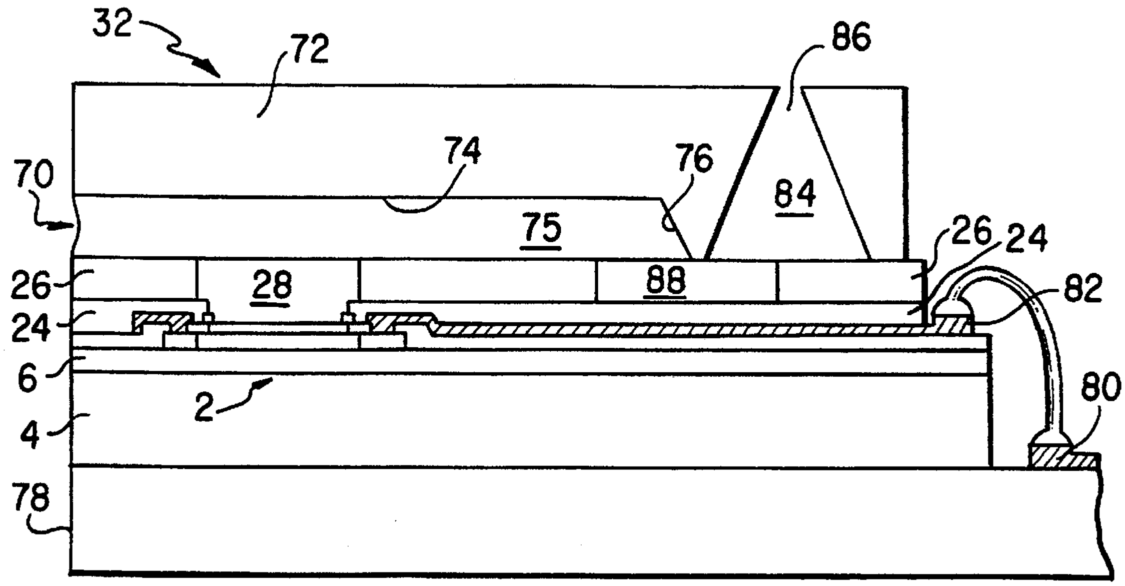
FIG. 6 is a cross-sectional view along a view line A—A of FIG. 5.

FIG. 5 is an enlarged schematic isometric view of the printhead 32 illustrated in FIG. 4 which shows the array of nozzles 70 in a front face 71 of a channel plate 72 of the printhead 32. Referring also to FIG. 6, which is a cross-sectional view along a view line A-A, a lower electrically insulating substrate 4 has heater elements 2 and terminals 82 patterned on a surface thereof while a channel plate 72 has parallel grooves 74 which extend in one direction and penetrate through a front face 71 of the channel plate 72. The other end of the grooves 74 terminates at a slanted wall 76.

The surface of the channel plate 72 and grooves 74 are aligned and bonded to the substrate 4 so that the plurality of heater elements 2 is positioned in each channel 75 formed by the grooves 74 and the substrate 4. The printhead 32 is mounted on a metal substrate 78 containing insulated electrodes 80 which are used to connect the heater elements to the controller 62. The metal substrate 78 serves as a heat sink to dissipate heat generated within the printhead 32. The electrodes 16, 18 on the substrate 4 terminate at the terminals 82. The channel plate 72 is smaller than that of the substrate 4 in order that the electrode terminals 82 are exposed and available for connection to the controller 62 via the electrodes 80 on the metal substrate 78.

An internal recess serves as an ink supply manifold 84 for the ink channels. The ink supply manifold 84 has an open bottom for use as an ink fill hole 86, and ink enters the manifold 84 and common recess 88 through the fill hole 86 and fills each channel 75 by capillary action. The ink at each nozzle 70 forms a meniscus at a slight negative pressure which prevents the ink from weeping therefrom.

By utilizing a flood gun during ion implantation of dopants into polysilicon with uniform grain size, the sheet resistances between the resistors of heater elements used in a printhead are substantially uniform. The uniform sheet resistance eliminates the problem of undervoltage which prevents the ejection of ink droplets and the problem of overvoltage which causes the ink to bake onto the resistors. The elimination of such problems extends the operating lifetime of the heater element and thus the printhead.

The foregoing embodiments are intended to be illustrative and not limiting. For example, the present invention is also applicable to printing systems which use a full-width printhead. Further, the present invention is applicable to a printhead having full pit channel geometry or open pit channel geometry. Thus, various modifications may be made without departing from the spirit and scope of the present invention as defined in the appended claims.

What is claimed is:

1. A method of fabricating a printhead having a polysilicon coated layer, the layer having a uniform sheet resistance comprising:

(a) forming the polysilicon layer of substantially uniform grain size on a substrate;

(b) doping the polysilicon layer with dopants;

(c) exposing the polysilicon layer to electrical charges generated by a flood gun during doping of the polysilicon layer; and (d) annealing the polysilicon layer.

2. The method of claim 1, wherein forming the polysilicon comprises chemical vapor deposition of polycrystalline silicon at at least one of a flat temperature profile and a ramped temperature profile.

3. The method of claim 1, wherein the step of forming the polysilicon comprises:

(i) chemical vapor deposition of amorphous silicon at at least' one of a flat temperature profile and a ramped temperature profile; and (ii) thermal cycling of the amorphous silicon at temperatures to convert the amorphous silicon to polysilicon.

4. The method of claim 1, wherein doping the polysilicon layer comprises at least one of ion implantation and diffusion of dopants into the polysilicon layer.

5. The method of claim 4, wherein the dopants are at least one of n-type and p-type dopants.

6. The method of claim 1, wherein the charges generated by the flood gun are low energy electrons.

7. A method of fabricating a heater element so that resistances between individual resistors of heater elements in a printhead and from printhead to printhead are substantially uniform, the method comprising the steps of:

(a) forming a resistor on a substrate of a heater element, the resistor forming step comprising:

(i) forming a polysilicon on a substrate;

(ii) doping the polysilicon with dopants while exposing the polysilicon to electrical charges generated by a flood gun, and (iii) annealing the polysilicon to form the resistor;

(b) forming contact means at each of two ends of the resistor;

(c) forming insulation means on top of the resistor and between the contact means;

(d) forming insulative films on top of the contact means and insulation means of the heater element.

8. The method of claim 7, wherein forming the polysilicon layer comprises chemical vapor deposition of polycrystalline silicon at at least one of a flat temperature profile and a ramped temperature profile.

9. The method of claim 7, wherein the step of forming the polysilicon comprises:

(i) chemical vapor deposition of amorphous silicon at at least one of a flat temperature profile and a ramped temperature profile; and (ii) thermal cycling of the amorphous silicon at temperatures to convert the amorphous silicon to polysilicon.

10. The method claim of 7, wherein the charges generated by the flood gun are low energy electrons.

11. The method of claim 7, wherein forming the contact means comprises:

(i) depositing oxide on top of the resistor;

(ii) depositing phosphosilicate glass on the oxide;

(iii) heating the oxide to reflow the phosphosilicate glass;

(iv) etching the phosphosilicate glass to form contact vias at each end of the resistor and to expose an area between the contact vias; and (v) forming electrodes at the contact vias.

12. The method of claim 7, wherein forming the insulation means comprises:

(i) forming at least one of a dielectric layer and an oxide layer on top of the resistor and between the contact means; and (ii) forming a Ta layer on top of at least one of the dielectric and oxide layers.

13. The method of claim 7, wherein forming the insulative films comprises:

(i) depositing a first insulative layer;

(ii) depositing a second insulative layer;

(iii) etching the second insulative layer to expose a portion of the first insulative layer; and (iv) etching the first insulative layer to expose the insulation means.

* * * * *